United States Patent [19]

Nguygen

[11] Patent Number: 4,486,465
[45] Date of Patent: Dec. 4, 1984

[54] METHOD FOR DEPOSITION ON A SEMICONDUCTOR WAFER

[75] Inventor: Bich-Yen Nguygen, Austin, Tex.

[73] Assignee: Motorola, Inc., Schaumburg, Ill.

[21] Appl. No.: 537,919

[22] Filed: Sep. 30, 1983

[51] Int. Cl.$^3$ .................... H01L 21/316; H01L 21/68
[52] U.S. Cl. ..................................... 427/85; 118/500; 427/94; 427/95
[58] Field of Search ................... 118/500; 427/94, 95, 427/85

[56] References Cited
U.S. PATENT DOCUMENTS

| 4,098,923 | 7/1978 | Alberti | 427/85 |
| 4,389,967 | 6/1983 | Shimoda | 118/500 |

OTHER PUBLICATIONS

Alliegro, "Diffusion Furnace Paddle", Western Electric Technical Digest, No. 22, Apr. 1971.

Primary Examiner—John D. Smith
Attorney, Agent, or Firm—James L. Clingan, Jr.

[57] ABSTRACT

A nitride-coated boat is used in a method for depositing phosphosilicate glass (PSG) on semiconductor wafers. Because stainless steel is the material typically used for the boat for PSG deposition, the linear coefficient of thermal expansion of the boat is significantly greater than that of PSG. Consequently, cooling the boat after PSG deposition tends to cause flaking of PSG from the boat. The nitride-coating on the boat buffers the contraction differential between the PSG and stainless steel to significantly reduce flaking of PSG.

8 Claims, 2 Drawing Figures

METHOD FOR DEPOSITION ON A SEMICONDUCTOR WAFER

FIELD OF THE INVENTION

This invention relates, in general, to semiconductor purposes, and more particularly to deposition on a semiconductor wafer.

BACKGROUND OF THE INVENTION

Deposition on semiconductor wafers is typically achieved by inserting a boat, which holds a number of wafers, into a chamber, commonly known as a tube. While inside the tube, gases are introduced which cause a deposition on the wafers. While the wafers are receiving the deposition, so is the boat which is holding the wafers. The deposition on the boat tends to flake off after removal of the boat from the tube. For example, in the case of depositing phosphosilicate glass (PSG), phosphorous doped silicon oxide, a stainless steel boat is typically used which has a different coefficient of expansion than PSG. Consequently, as a PSG-coated boat changes temperature, PSG particles flake off the boat. Upon removal of the boat from the tube, the wafers can be removed, but not before at least some flaking occurs. If new wafers are placed in the boat, PSG particles from the boat will flake onto those wafers. Subsequent deposition of PSG will not be effected where the particles have flaked onto the wafers. These wafers are then removed and cleaned. The cleaning process removes the particles, leaving a hole in the PSG coating. Any semiconductor die formed in an area which includes such a hole will be defective.

It is desirable to wait until the temperature of a PSG-coated boat has stabilized before placing wafers in the boat. Even so, flaking of PSG particles continues, presumably because they have been loosened during the cool down period. Although quartz boats will reduce flaking substantially, quartz boats are not as durable as stainless steel, and break much more easily. Stainless steel boats for PSG deposition are much more desirable than quartz boats.

SUMMARY OF THE INVENTION

An object of the subject invention is to provide an improved method for deposition on a semiconductor wafer.

Another object of the invention is to provide a stainless boat with reduced flaking for use in deposition on semiconductor wafers.

Yet another object of the invention is to provide a method for reducing flaking of PSG onto semiconductor wafers.

These and other objects of the subject invention are achieved by a nitride-coated, metal boat used for holding a semiconductor wafer in a process for depositing a material on the wafer, wherein the material has a significantly different linear coefficient of thermal expansion than that of the metal of the nitride-coated boat.

DESCRIPTION OF A PREFERRED EMBODIMENT

Figure 1:
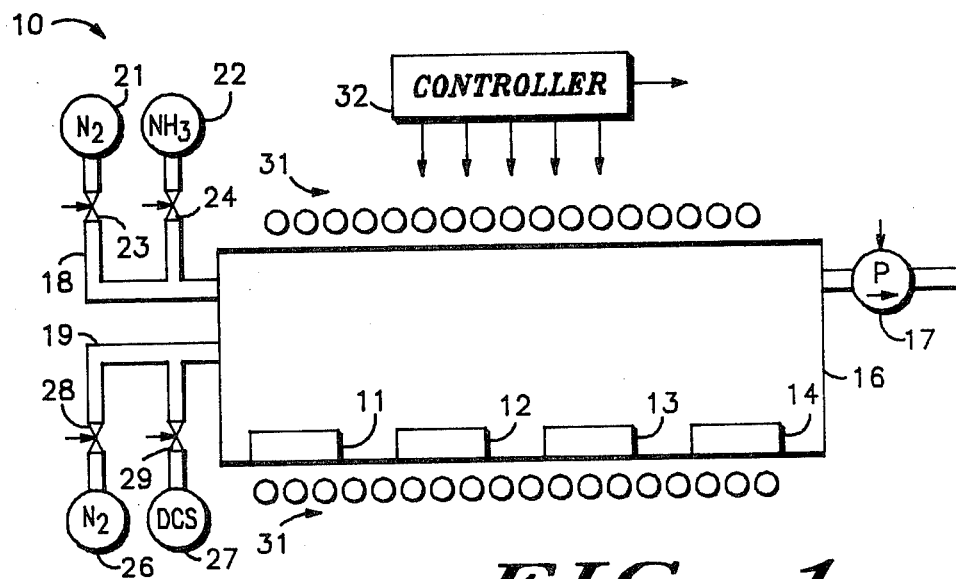
FIG. 1 shows in schematic form an apparatus for providing boats with reduced flaking characteristics according to a preferred embodiment of the invention.

Shown in FIG. 1 is an apparatus 10 for providing boats 11, 12, 13 and 14 with improved flaking characteristics. Apparatus 10 includes a tube 16 having a pump 17 at one end and gas entry pipes 18 and 19 at the other end. Containers 21 and 22 of nitrogen ($N_2$) and ammonia ($NH_3$), respectively, are coupled to tube 16 via pipe 18 under the control of flow controllers 23 and 24, respectively. Containers 26 and 27 of nitrogen and dichorosilane ($SiH_2Cl_2$, hereinafter referred to as DCS), respectively, are coupled to tube 16 via pipe 19 under the control of flow controllers 28 and 29, respectively. Pipes 18 and 19 are shown for convenience as one being over the other but in practice are preferably side by side. Heating coils 31 surround tube 16 to heat tube 16 to a desired temperature. A controller 32 provides signals to flow controllers 23, 24, 28, and 29. Tube 16 is of conventional quartz crystal which is commercially available. Controller 32, pump 17, and heating coils 31 are all commercially available and known for use in nitride deposition.

Boats 11–14 are stainless steel with perforations and are shown inside tube 16 with boat 14 nearest the pump end and boat 11 nearest the other end. To deposit nitride on boats 11–14, a typical procedure for depositing nitride on silicon wafers is used. With tube 16 maintained at 650° C. by heating coils 31, boats 11–14 are inserted into tube 16. Tube 16 is pumped down by pump 17 to a vacuum of in the order of 1 milliTorr for 10 minutes. Nitrogen from container 21 is flowed through tube 16 to purge tube 16 at a pressure of about 200 milliTorr for 10 minutes. Tube 16 is then again pumped down. Ammonia from container 22 is flowed through tube 16 at a rate of 135 SCCM for 3 minutes before introducing DCS from container 27. After the 3 minutes DSC is flowed through tube 16 at a rate of 30 SCCM while ammonia is still flowing at 135 SCCM. Pressure in tube 16 is about 500 milliTorr while both ammonia and DCS are flowing. With both DCS and ammonia flowing, nitride is being deposited on the wafers. Consequently, the time duration chosen for flowing ammonia and DSC together is directly related to the desired nitride thickness on boats 11–14, i.e., the thicker the desired nitride, the longer the required time duration. Typically, the time duration is determined experimentally. An ammonia to DCS ratio of 4.5 to 1 is maintained even though the nitride reaction implies a 10 to 3 ratio in order to ensure that the DCS fully reacts.

After the desired time duration has lapsed, the DCS flow is stopped while the ammonia flow continues for an additional three minutes to ensure there is no DCS residue. Tube 16 is pumped down again to complete the process of clearing tube 16 of ammonia and DCS. Nitrogen from container 21 is flowed into tube 16 for 5 minutes with pump 17 turned off to begin backfilling tube 16. Nitrogen from container 26 is flowed until atmospheric pressure is reached to complete the backfilling process. Nitrogen from container 21 is provided at a relatively low pressure compared to that provided by container 26. The backfilling process begins by introducing nitrogen from container 21 so that the pressure inside tube 16 does not change too rapidly. After tube 16 has been backfilled, boats 11–14 are removed. Boats 11–14 are consequently coated with nitride. As such, boats 11–14 are useful for holding semiconductor wafers during an oxide deposition process step to reduce flaking of oxide from boats 11–14. A thickness range of 3000–4000 A of nitride on boats 11–14 has been shown to provide significantly reduced flaking. Greater thicknesses of nitride would presumably also show significantly reduced flaking. Boats 11–14 are particularly useful in an oxide deposition step which includes phosphorous for a passivation layer. Such a layer is commonly known as PSG for phosphosilicate glass. A PSG layer is normally a relatively thick layer for which special considerations are necessary for ensuring uniformity. One such consideration is requiring that boats 11–14 have many perforations. Such perforations in a solid silicon boat cause such boat to be extremely fragile, essentially impractical in a production environment.

Figure 2:
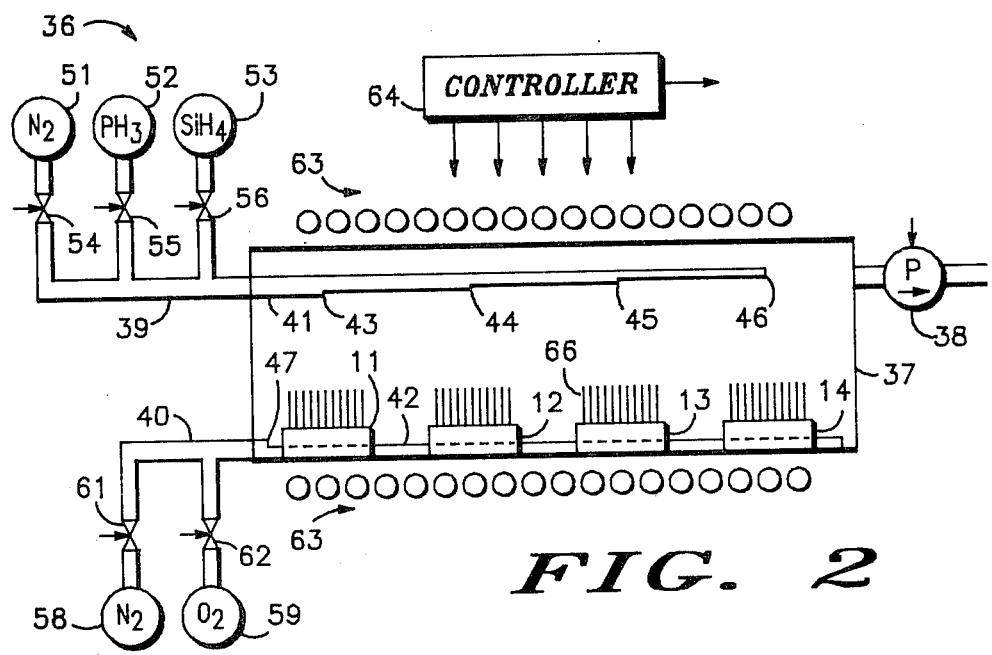
FIG. 2 shows in schematic form an apparatus for using boats with reduced flaking characteristics according to the preferred embodiment of the invention.

Shown in FIG. 2 is an apparatus 36 which is very similar to apparatus 10 of FIG. 1 but which is set up for depositing PSG. Apparatus 36 includes a tube 37, having a pump 38 at one end and gas entry pipes 39 and 40 shown for convenience as being at the other end. In practice it may be desirable to have gas entry pipes 39 and 40 at the same end as pump 38. Gas entry pipes 39 and 40 have extensions 41 and 42, respectively, into tube 16. Extension 41 is comprised of four separate small pipes (not individually shown) which terminate at points 43, 44, 45 and 46, to correspond to boat locations in tube 37. Extension 42 extends the length of tube 37 underneath boats 11, 12, 13, and 14. Extension 42 is perforated all along its length. In addition there is a gas entry point 47 from gas entry pipe 40 at the end opposite to pump 38. Gas entry pipes can also be located on the same side of tube 16 as pump 38 but points 43, 44, 45, 46 and 47 would be the same. Containers 51, 52, and 53 of nitrogen, phosphine ($PH_3$), and silane ($S_iH_4$), respectively, are coupled to tube 37 via pipe 39 under the control of flow controllers 54, 55, and 56, respectively. Containers 58 and 59 of silicon and oxygen ($O_2$), respectively, are coupled to tube 37 via pipe 40 under the control of flow controllers 61 and 62, respectively. Heating coils 63 surround tube 37 to heat tube 37 to a desired temperature. A controller 64 provides signals to flow controllers 54, 55, 56, 61 and 62 and pump 38. Tube 37 is a conventional metal tube which is commercially available. Controller 64, pump 38, heating coils 63, and gas entry tubes 39 and 40 with extensions 41 and 42, respectively, are all known to be commercially available for a PSG deposition.

For PSG deposition, tube 37 is maintained at about 450° C. by heating coils 63. Boats 11–14, after receiving a coat of nitride as described for FIG. 1, are inserted into tube 37 carrying semiconductor wafers. A typical wafer 66 is shown as being in boat 13. The semiconductor material of the wafers is preferably silicon. For convenience, FIG. 2 shows 11 wafers in each boat 11–14, whereas a typical boat in practice preferably holds 30 wafers. Tube 37 is pumped down to a vacuum of in the order of 1 milliTorr. Nitrogen from container 51 is flowed through tube 37 to purge tube 37 at a pressure of about 200 milliTorr for 3 minutes. Tube 37 is again pumped down. Oxygen from container 59 is flowed through tube 37 at a rate of 120 SCCM for about 6 seconds. Silane and phosphine from containers 53 and 52, respectively, are simultaneously flowed through tube 37 at rates of 48 SCCM and 6.5 SCCM, respectively. Pressure in tube 37 is about 250 milliTorr while oxygen, silane, and phosphine are flowing. The oxygen, silane, and phosphine react in conventional fashion to form PSG and hydrogen ($H_2$). The PSG is deposited on the wafers and boats 11–14 while the hydrogen is removed via pump 38. The mixture of silane and phosphine enter tube 37 at points 43–46 while the oxygen enters at points 47 and through tiny holes all along extension 42 to obtain uniform deposition on the wafers.

After the desired deposition has been obtained, the flow of silane and phosphine into tube 37 is stopped while the flow of oxygen continues for 1 minute. Tube 37 is pumped down again to complete the process of clearing tube 37. Nitrogen from container 51 is flowed through tube 37 for 1 minute then pump 38 is turned off so that tube 37 begins backfilling for 5 minutes. Nitrogen from container 58 is flowed until atmospheric pressure is reached to complete the backfilling process. Boats 11–14 are then removed.

As boats 11–14 cool down subsequent to removal, the stainless steel, nitride and PSG of boats 11–14 contract. The linear coefficients of thermal expansion of stainless steel, nitride, and PSG are $17.2 \times 10^{-6}/°C.$, $2.5 \times 10^{-6}/°C.$, and $0.5 \times 10^{-6}/°C.$, respectively. Consequently, boats 11–14 contract more than the PSG coating, tending to cause PSG to flake off. The nitride layer between the PSG and stainless steel acts as a buffer to reduce flaking of PSG from boats 11–14. Boats 11–14 can be reused many times even though the PSG accumulates on boats 11–14. Boats 11–14 with a nitride coating continue to provide a significant reduction in flaking until at least a thickness of 20 microns of PSG accumulates on boats 11–14. After boats 11–14 have cooled sufficiently, the wafers can be removed from boats 11–14 and new wafers for receiving PSG can be placed in the boats.

While the invention has been described in a preferred embodiment, it will be apparent to those skilled in the art that the disclosed invention may be modified in numerous ways and may assume many embodiments other than that specifically set out and described above. For example, a nitride-coated boat may be useful in other cases than for PSG deposition. The nitride coating could be a buffer between any deposited material which has a significantly different linear coefficient of thermal expansion than the metal of the boat. Accordingly, it is intended by the appended claims to cover all modifications of the invention which fall within the true spirit and scope of the invention.

I claim:

1. A method for using a metal boat coated with nitride, comprising the steps of:
    placing semiconductor wafers in the boat;
    placing the boat in a heated tube; and
    introducing silane, phosphine, and oxygen into said tube to deposit phosphosilicate glass on said wafers.

2. The method of claim 1 wherein the boat is perforated stainless steel.

3. A process for depositing phosphosilicate glass on a semiconductor wafer, comprising the steps of:
    heating a first tube;
    inserting a stainless steel boat into the first tube;
    introducing ammonia and dichlorosilane into the first tube to deposit nitride on the boat;
    placing the wafer in the boat;
    heating a second tube;
    inserting the nitride-coated boat with the semiconductor wafer into the second tube; and introducing silane, phosphine, and oxygen into the tube to coat the wafer with phosphosilicate glass.

4. The method of claim 3 wherein the second tube is heated to at least 400° C.

5. A process for consecutively subjecting groups of semiconductor wafers to phosphosilicate glass deposition, comprising:
coating a metal boat with nitride;
heating a tube;
placing a first group of semiconductor wafers in the boat;
inserting the nitride-coated boat into the tube;
introducing silane, phosphine, and oxygen into the tube to deposit phosphosilicate glass on the first group of wafers;
removing the nitride-coated boat from the tube;
removing the first group of wafers from the nitride-coated boat;
placing a second group of semiconductor wafers in the nitride-coated boat;
placing the nitride-coated boat containing the second group of wafers into the tube; and
introducing silane, phosphine, and oxygen into the tube to deposit phosphosilicate glass on the second group of wafers.

6. A method for making a deposition of material onto a semiconductor wafer placed in a metal boat, wherein the linear coefficient of thermal expansion of the metal is significantly different from that of the material, comprising the steps of:
coating the metal boat with nitride;
placing the wafer in the boat;
inserting the nitride-coated boat into a heated tube;
introducing gases into the tube to form said material, wherein said material is deposited on the wafer and the nitride-coated boat; and
removing the nitride-coated boat from the heated tube and into an environment of significantly lower temperature than that of the heated tube.

7. The method of claim 6 wherein the metal boat is perforated stainless steel.

8. The method of claim 7 wherein the tube is heated to at least 400° C.

* * * * *